(12) United States Patent
Kuznetsov

(10) Patent No.: US 11,418,031 B2
(45) Date of Patent: Aug. 16, 2022

(54) ACTIVELY-CONTROLLED POWER TRANSFORMER AND METHOD FOR CONTROLLING

(71) Applicant: Raytheon Company, Waltham, MA (US)

(72) Inventor: Stephen B. Kuznetsov, Marlborough, MA (US)

(73) Assignee: Raytheon Company, Waltham, MA (US)

(*) Notice: Subject to any disclaimer, the term of this patent is extended or adjusted under 35 U.S.C. 154(b) by 224 days.

(21) Appl. No.: 15/929,541

(22) Filed: May 8, 2020

(65) Prior Publication Data

US 2021/0351588 A1 Nov. 11, 2021

(51) Int. Cl.
| | | |
|---|---|---|
| *H02J 3/01* | (2006.01) |
| *H01F 27/24* | (2006.01) |
| *H01F 27/28* | (2006.01) |
| *H01F 27/34* | (2006.01) |
| *H01F 27/40* | (2006.01) |
| *H03H 7/01* | (2006.01) |

(52) U.S. Cl.
CPC ............ *H02J 3/01* (2013.01); *H01F 27/24* (2013.01); *H01F 27/28* (2013.01); *H01F 27/34* (2013.01); *H01F 27/40* (2013.01); *H03H 7/0115* (2013.01)

(58) Field of Classification Search
CPC .. H02J 3/01; H01F 27/24; H01F 27/28; H01F 27/34; H01F 27/40; H01F 27/385; H03H 7/0115
See application file for complete search history.

(56) References Cited

U.S. PATENT DOCUMENTS

| | | | |
|---|---|---|---|
| 1,646,823 A | 10/1927 | Karapetoff |
| 2,149,082 A | 2/1939 | Buell et al. |
| 2,740,510 A | 4/1956 | Berthold |
| 3,004,381 A | 10/1961 | Schweitzer, Jr. |
| 3,024,298 A | 3/1962 | Goltsos et al. |
| 3,183,431 A | 5/1965 | Ford |
| 3,187,250 A | 6/1965 | Born et al. |

(Continued)

FOREIGN PATENT DOCUMENTS

| | | | |
|---|---|---|---|
| EP | 0849170 A1 | 6/1998 |
| ES | 2684108 A1 * | 10/2018 | ............... G05F 3/06 |

(Continued)

OTHER PUBLICATIONS

International Search Report and Written Opinion of the International Searching Authority in connection with PCT/US2016/012513 dated May 30, 2016, 11 pages.

(Continued)

*Primary Examiner* — Pinping Sun

(57) ABSTRACT

A transformer includes a magnetic core having multiple limbs. The transformer also includes a direct current (DC) bias winding wound around a specified one of the limbs. The transformer further includes a DC amplifier electrically connected to the DC bias winding. The DC amplifier is configured to receive a first signal associated with a load output current or voltage. The DC amplifier is also configured to determine an amount of a current for the DC bias winding based on the first signal. The DC amplifier is further configured to send the determined amount of current through the DC bias winding.

22 Claims, 8 Drawing Sheets

(56) References Cited

U.S. PATENT DOCUMENTS

| | | | |
|---|---|---|---|
| 3,315,148 A | 4/1967 | Grillo | |
| 3,452,229 A | 6/1969 | Pimlott et al. | |
| 3,571,693 A | 3/1971 | Riaz | |
| 3,667,012 A | 5/1972 | Kilgore | |
| 4,001,666 A | 1/1977 | Grenfell | |
| 4,011,535 A | 3/1977 | Kosky et al. | |
| 4,048,603 A | 9/1977 | Staub et al. | |
| 4,393,964 A | 7/1983 | Kemper | |
| 4,439,720 A | 3/1984 | Georges | |
| 4,444,444 A | 4/1984 | Benedetti et al. | |
| 4,612,494 A | 9/1986 | Kawamura | |
| 4,926,107 A | 5/1990 | Pinson | |
| 4,971,522 A | 11/1990 | Butlin | |
| 5,097,194 A | 3/1992 | Walton et al. | |
| 5,109,185 A | 4/1992 | Ball | |
| 5,313,381 A * | 5/1994 | Balakrishnan | H02M 3/33507 363/21.07 |
| 5,646,458 A | 7/1997 | Bowyer et al. | |
| 5,921,505 A | 7/1999 | Spector | |
| 5,995,382 A * | 11/1999 | Miyazaki | H02M 3/3385 323/902 |
| 6,023,152 A | 2/2000 | Briest et al. | |
| 6,078,119 A | 6/2000 | Satoh et al. | |
| 6,118,678 A | 9/2000 | Limpaecher et al. | |
| 6,239,513 B1 | 5/2001 | Dean et al. | |
| 6,480,401 B2 * | 11/2002 | Tang | H02M 3/33507 363/21.02 |
| 6,573,626 B1 | 6/2003 | Gosebruch et al. | |
| 6,710,579 B2 | 3/2004 | Ebel et al. | |
| 7,663,328 B2 | 2/2010 | Gonder | |
| 7,710,081 B2 | 5/2010 | Saban et al. | |
| 7,957,160 B2 | 6/2011 | Babcock et al. | |
| 9,118,289 B1 * | 8/2015 | Fraley | H03F 9/00 |
| 9,531,247 B2 | 12/2016 | Kuznetsov | |
| 9,531,289 B2 | 12/2016 | Kuznetsov | |
| 9,667,232 B2 | 5/2017 | Kuznetsov | |
| 9,837,996 B2 | 12/2017 | Kuznetsov | |
| 10,491,074 B2 | 11/2019 | Kuznetsov | |
| 10,650,959 B1 * | 5/2020 | Folker | H01F 38/023 |
| 2004/0130921 A1 | 7/2004 | Fukumoto | |
| 2005/0012395 A1 | 1/2005 | Eckroad et al. | |
| 2009/0134705 A1 | 5/2009 | Kalev | |
| 2010/0194373 A1 * | 8/2010 | Hamberger | H01F 27/38 323/356 |
| 2011/0084568 A1 | 4/2011 | Lateb et al. | |
| 2012/0112835 A1 * | 5/2012 | Comeau | H03F 1/22 330/252 |
| 2012/0187922 A1 | 7/2012 | Dubois et al. | |
| 2012/0286523 A1 | 11/2012 | Hull et al. | |
| 2013/0020893 A1 | 1/2013 | Bradley et al. | |
| 2013/0127391 A1 | 5/2013 | Lewis | |
| 2013/0257186 A1 | 10/2013 | Kozar et al. | |
| 2013/0260999 A1 | 10/2013 | Hull et al. | |
| 2013/0261001 A1 | 10/2013 | Hull et al. | |
| 2014/0346868 A1 | 11/2014 | Kuznetsov | |
| 2016/0149504 A1 * | 5/2016 | Quigley | H02M 1/36 363/21.04 |
| 2018/0034372 A1 * | 2/2018 | Jacobson | H01F 27/40 |
| 2019/0280599 A1 | 9/2019 | Moffat et al. | |
| 2020/0195160 A1 * | 6/2020 | Mayell | H02M 3/33592 |

FOREIGN PATENT DOCUMENTS

| | | | |
|---|---|---|---|
| ES | 2684108 A1 | | 10/2018 |
| JP | S5913313 A | * | 1/1984 |
| JP | S5913313 A | | 1/1984 |

OTHER PUBLICATIONS

Kilgore et al., "Energy Storage at Site Permits Use of Large Excavators on Small Power Systems," Westinghouse Engineer, Nov. 1970, vol. 30, No. 6, pp. 162-167.

International Search Report and Written Opinion of the International Searching Authority in connection with PCT/US2015/017264, dated Sep. 2, 2015, 5 pages.

Narbut et al., "Vaporization Cooling for Power Transformers," Transaction of the AIEE, Power Apparatus Systems, Part III, Dec. 1959, 7 pages.

Moore et al., "Design and Performance Characteristics of Gas/Vapor Transformers," Trans. IEEE, Power Apparatus Systems, vol. PAS-101, Jul. 1982, 4 pages.

Strasik, "Flywheel Electricity Systems with Superconducting Bearings for Utility Applications," Boeing Phantom Works, Jul. 2004, 32 pages.

Walls, "Rotating machines for pulsed power," IEEE Conference Record of the 25th International Symposium and 2002 High-voltage Workshop, Jun.-Jul. 2002, 8 pages.

3M Electronics, "3M Novec 649 Engineered Fluid", Product Information Sheet, Sep. 2009, 4 pages.

Limpaecher et al. "Resonant Link PFN Charger and Modular Power Supply," Science Application International Corporation Electrical Power Technology Division, IEEE, 2007, pp. 1495-1499.

International Search Report and Written Opinion of the International Searching Authority dated Jul. 26, 2021 in connection with International Patent Application No. PCT/US2021/026692, 8 pages.

* cited by examiner

ACTIVELY-CONTROLLED POWER TRANSFORMER AND METHOD FOR CONTROLLING

TECHNICAL FIELD

This disclosure is generally directed to electrical power systems. More specifically, this disclosure is directed to an actively-controlled power transformer and a method for controlling the power transformer.

BACKGROUND

Many existing power systems, such as those used in radar systems, use heavy external electrical equipment to limit current inrush and harmonic filtering to a main power transformer. Unfortunately, conventional passive filters typically cause input line power to be overcompensated, which can cause system voltage levels to rise above normal levels when a load on a power system is light.

SUMMARY

This disclosure relates to an actively-controlled power transformer and a method for controlling the power transformer.

In a first embodiment, a transformer includes a magnetic core having multiple limbs. The transformer also includes a direct current (DC) bias winding wound around a specified one of the limbs. The transformer further includes a DC amplifier electrically connected to the DC bias winding. The DC amplifier is configured to receive a first signal associated with a load output current, voltage, harmonic level, or output power. The DC amplifier is also configured to determine an amount of a current for the DC bias winding based on the first signal. The DC amplifier is further configured to send the determined amount of current through the DC bias winding.

In a second embodiment, a method includes receiving, at a DC amplifier, a first signal associated with a source input current, voltage, power, or harmonic level. The method also includes determining an amount of a current for a DC bias winding based on the first signal. The method further includes sending, by the DC amplifier, the determined amount of current through the DC bias winding to improve power regulation, current inrush, or harmonic level. The DC bias winding is electrically connected to the DC amplifier. A magnetic core has multiple limbs, and the DC bias winding is wound around a specified one of the limbs.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 9, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

As noted above, radar power systems or other power systems often use heavy external electrical equipment to limit current inrush and harmonic filtering to a main power transformer. One example system uses a separate subsystem for limiting inrush current to a main radar transformer, requiring over 300 cubic feet of space and having a weight of approximately one ton. Thus, any options to reduce weight or size are welcome. Some current limiting systems utilize a three-phase resistor bank with consequent dissipation of over 100 kW for a 2 MW radar. These systems can include passive harmonic filters designed for the high voltage side input. However, these systems do not use current feedback to actively control inrush or peak currents. Moreover, these filter systems use fixed L-C networks independent of load, meaning the input line power factor is often overcompensated.

To address these or other issues, this disclosure provides actively-controlled power transformers and methods for controlling the power transformers. The disclosed transformers feature integral and adjustable current limiting capabilities that are built into the transformer magnetics and also allow active tuning of L-C passive filters magnetically coupled to the transformers. The result is a significant savings in weight, size, and cost of large installations for mobile and land-based radar power systems and other power systems.

Figure 1:
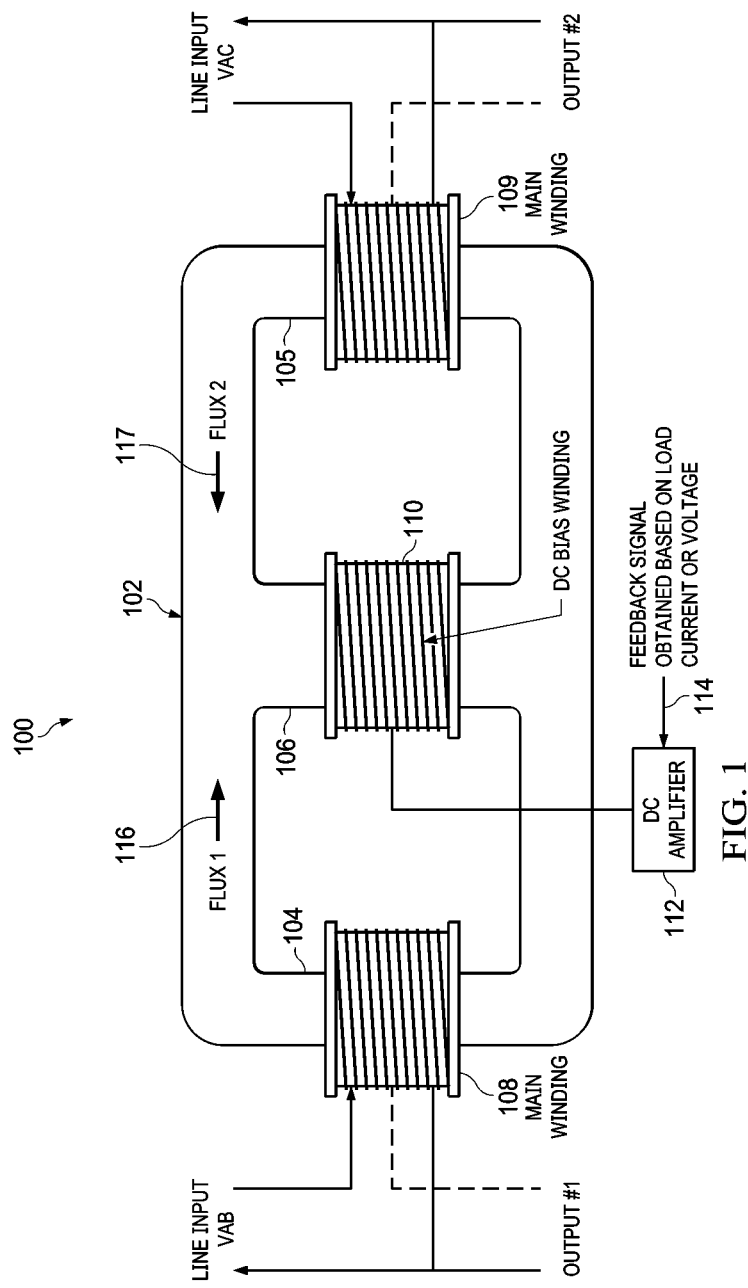
FIG. 1 illustrates an example actively-controlled power transformer according to this disclosure.

FIG. 1 illustrates an example actively-controlled power transformer 100 according to this disclosure. As described below, the transformer 100 is an actively-controlled power transformer that includes integral inrush current limiting and integral harmonic filtering. While the transformer 100 is described as a two-phase auto-transformer, the principles described here can apply to one-phase units or units with more than two phases, such as a three-phase galvanic isolation unit.

As shown in FIG. 1, the transformer 100 includes a magnetic core 102 with multiple limbs, including outer limbs 104-105 and a center limb 106. The outer limbs 104-105 respectively include main windings 108-109, which are each associated with a line input and a line output providing power to a load (such as a radar system). For example, the outputs of the transformer 100 can feed an array of alternating current/direct current (AC/DC) power supplies that provide radar pulses. In some embodiments, the input voltage to the transformer 100 is approximately 4160 volts, and the transformer 100 reduces the voltage to an output of approximately 480 volts. Of course, other input and output voltages are possible and within the scope of this disclosure.

The transformer 100 is a two-phase auto-transformer that has central core fluxes 116-117 flowing from the outer limbs 104-105 to the center limb 106. Wound around the center limb 106 is a DC bias winding 110. While only one DC bias winding 110 is shown in FIG. 1, other embodiments may include additional DC bias windings on additional limbs. The fluxes 116-117 are controlled in saturation level by the DC magnetization level of the DC bias winding 110.

The DC bias winding 110 is electrically connected to a DC amplifier 112. The DC amplifier 112 controls the DC current flowing through the DC bias winding 110 in order to control the flux level in the transformer 100. In some embodiments, the DC amplifier 112 can feed the current to the DC bias winding 110 in direct response to a feedback signal 114 that is generated based on an output current of a radar or other load. The DC amplifier 112 includes any suitable structure configured to receive one or more signals and provide biasing current, such as one or more processing devices, memories, control circuitry, and the like. In some cases, the feedback signal 114 is generated by a signal processing system, which may take a pulsed radar output current waveform or other waveform and rectify and integrate the waveform into the feedback signal 114. In other cases, the feedback signal 114 is based on a voltage waveform of a load output instead of a current waveform. Further details of an example signal processing system are provided below.

In operation, the DC amplifier 112 receives and samples the feedback signal 114 for phase (such as power factor) and amplitude information. Based on analysis of the feedback signal 114, the DC amplifier 112 determines an amount of current for excitation of the DC bias winding 110 to control saturation of the transformer 100, which is directly related to transformer load. For example, when the load is light (as indicated by a higher-than-normal flux through the core 102), the DC saturation control current can be increased. The DC amplifier 112 then sends the current through the DC bias winding 110 at the determined amount.

The DC amplifier 112 is capable of quickly (such as within 5-10 milliseconds) detecting a change in the load and actively controlling the current at the DC bias winding 110 in response to the change in the load. This is in contrast to conventional transformers, which may include a bias winding but where the winding is set by a fixed value and is not dynamically controlled. In some embodiments, the DC amplifier 112 can be responsive to just the feedback signal 114, which is derived from the load output current magnitude and phase angle. In other embodiments, the feedback signal 114 to the DC amplifier 112 can be more sophisticated and be additionally responsive to the harmonics of the load output current. Examples of such embodiments are described in greater detail below.

Although FIG. 1 illustrates one example of an actively-controlled power transformer 100, various changes may be made to FIG. 1. For example, various components in FIG. 1 may be combined, further subdivided, replicated, omitted, or placed in any other suitable arrangement and additional components may be added according to particular needs. In general, power transformers come in a wide variety of configurations, and FIG. 1 does not limit this disclosure to any particular configuration of power transformer. Also, while FIG. 1 illustrates one example operational environment in which an actively-controlled power transformer can be used, this functionality may be used in any other suitable system.

Figure 2:
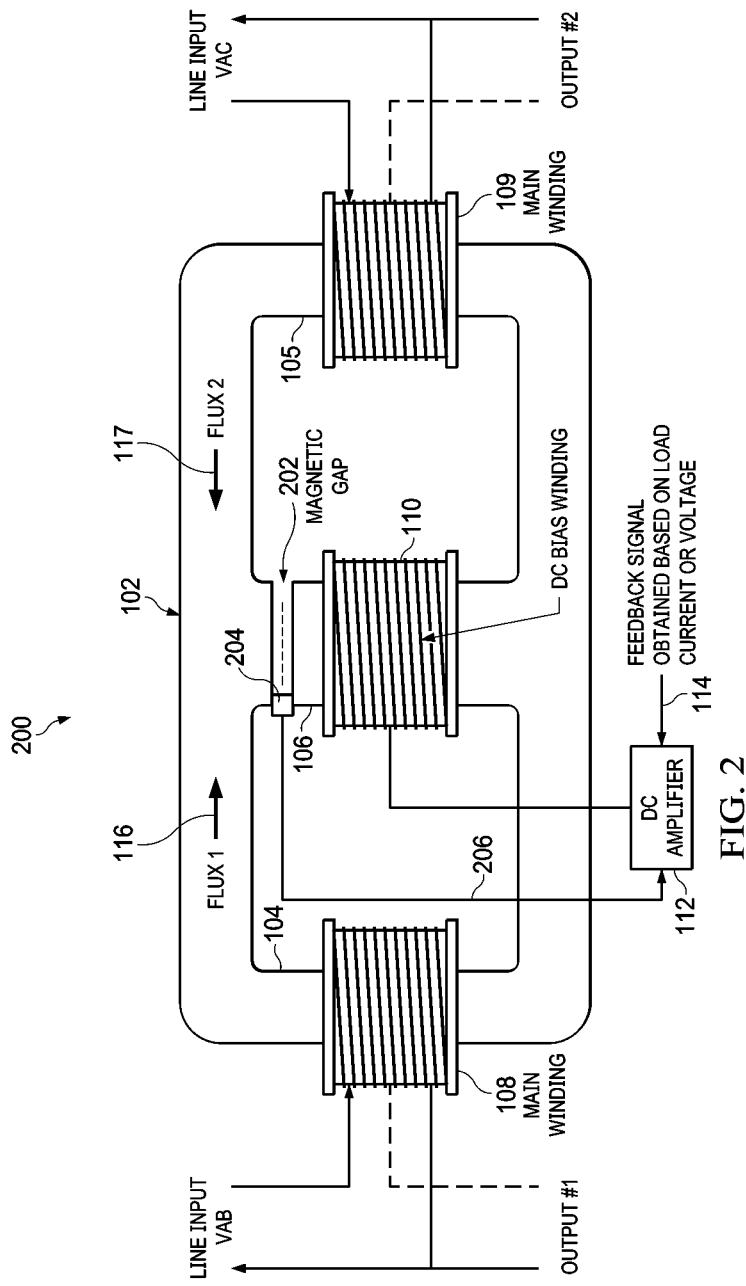
FIG. 2 illustrates another example actively-controlled power transformer according to this disclosure.

FIG. 2 illustrates another example actively-controlled power transformer 200 according to this disclosure. As described below, the transformer 200 is an actively-controlled polyphase power transformer that includes integral inrush current limiting and integral harmonic filtering. While the transformer 200 is described as a two-phase auto-transformer, the principles described here can apply to one-phase units or units with more than two phases, such as a three-phase galvanic isolation unit.

As shown in FIG. 2, the transformer 200 includes various components that may be the same as or similar to corresponding components in the transformer 100 of FIG. 1. For example, the transformer 200 includes a magnetic core 102 with outer limbs 104-105 and a center limb 106. The outer limbs 104-105 respectively include main windings 108-109, and the center limb 106 includes a DC bias winding 110. The DC bias winding 110 is electrically connected to a DC amplifier 112.

In the transformer 200, the center limb 106 includes a magnetic gap 202, which is a physical void area in the center limb 106. The magnetic gap 202 is provided to help control flux saturation in the transformer 200. In some embodiments, the magnetic gap 202 may be approximately 3 mm-5 mm thick, although the magnetic gap 202 may be smaller or larger.

The transformer 200 also includes a flux sensor 204 disposed in or near the magnetic gap 202. The flux sensor 204 is configured to sense flux across the magnetic gap 202. The flux sensor 204 is also electrically connected to the DC amplifier 112 and can provide information to the DC amplifier 112 about the magnitude and phase of the flux through the magnetic gap 202. During operation, the flux sensor 204 (continuously, periodically, or at other suitable times) detects and measures the flux through the magnetic gap 202 and provides a feedback signal 206 to the DC amplifier 112 indicating the flux. This can be useful since the flux is very dependent on overall magnetic conditions and can quickly change. The flux sensor 204 represents any suitable sensing device configured to measure flux and generate a feedback signal. In some embodiments, the flux sensor 204 can be a Hall-effect probe or a magnetic sensor with wound field coils.

In the transformer 200, the DC amplifier 112 receives both the feedback signal 206 from the flux sensor 204 and the feedback signal 114 from the load output current. The DC amplifier 112 processes both signals 206 and 114 using any suitable routine or algorithm to determine the current to apply to the DC bias winding 110 in order to control saturation in the transformer 200. The feedback signal 206 helps to modulate the current going to the DC bias winding 110 to avoid over-driving the DC bias winding 110. This helps to ensure fast control of current limiting at any applied input voltage level. In some embodiments, the feedback signal 114 is considered the primary signal and the feedback signal 206 is considered the secondary signal such that the DC amplifier 112 gives more weight to the feedback signal 114 in the determination of the current to the DC bias winding 110. The feedback signal 114 typically contains the maximum level of undesirable harmonics due to output rectification, and the feedback signal 206 typically contains a lower level of harmonics, yet this level may be in excess of acceptable industry standards for the line harmonics. Consequently, by comparing the signals 114 and 206, the DC amplifier 112 is able to determine the amount of attenuation the transformer inherently offers to higher harmonics, such as the 5th, 7th, 11th, 13th, 19th, and 21st harmonics. However, in other embodiments, more priority may be given to the feedback signal 206, or the signals 114 and 206 may be given equal priority.

In a polyphase transformer with multiple outputs, the system could contain one feedback output current signal from each phase and the control system could contain a summation junction of output current signals to determine the optimum DC bias current. In one embodiment, the transformer 200 has multiple limbs each with its own magnetic core gap and multiple bias coils typically arranged as one bias coil per phase.

Although FIG. 2 illustrates another example of an actively-controlled power transformer 200, various changes may be made to FIG. 2. For example, various components in FIG. 2 may be combined, further subdivided, replicated, omitted, or placed in any other suitable arrangement and additional components may be added according to particular needs. Again, power transformers come in a wide variety of configurations, and FIG. 2 does not limit this disclosure to any particular configuration of power transformer. Also, while FIG. 2 illustrates another example operational environment in which an actively-controlled power transformer can be used, this functionality may be used in any other suitable system.

Figure 3:
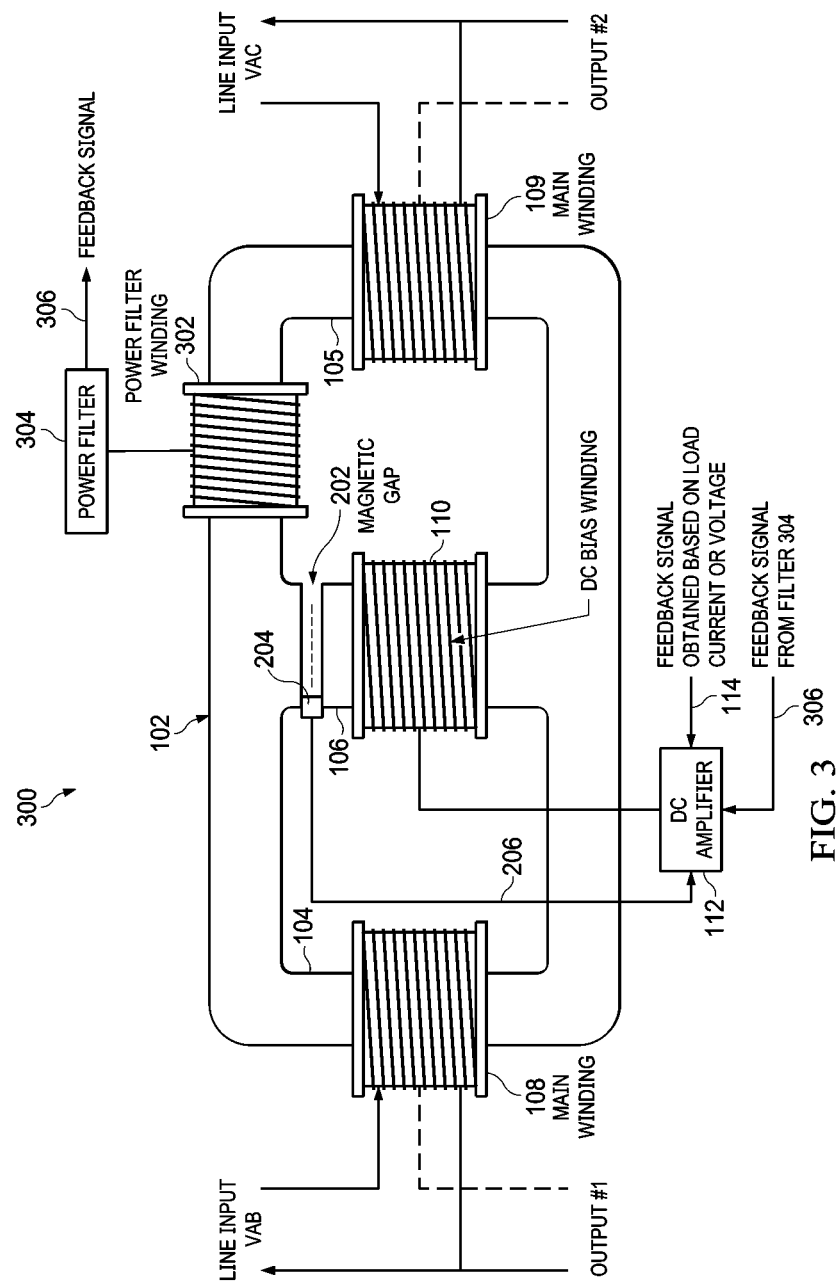
FIG. 3 illustrates yet another example actively-controlled power transformer according to this disclosure.

FIG. 3 illustrates yet another example actively-controlled power transformer 300 according to this disclosure. As described below, the transformer 300 is an actively-controlled power transformer that includes integral inrush current limiting and integral harmonic filtering. While the transformer 300 is described as a two-phase auto-transformer, the principles described here can apply to one-phase units or units with more than two phases, such as a three-phase galvanic isolation unit.

As shown in FIG. 3, the transformer 300 includes various components that may be the same as or similar to corresponding components in the transformer 100 of FIG. 1 or the transformer 200 of FIG. 2. For example, the transformer 300 includes a magnetic core 102 with outer limbs 104-105 and a center limb 106. The outer limbs 104-105 respectively include main windings 108-109, and the center limb 106 includes a DC bias winding 110. The DC bias winding 110 is electrically connected to a DC amplifier 112. The center limb 106 includes a magnetic gap 202, and a flux sensor 204 is disposed in or near the magnetic gap 202.

The transformer 300 also includes a power filter winding 302 that is electrically connected to a power filter 304 external to the transformer 300. The power filter winding 302 is wound around the magnetic core 102 and is electrically isolated from the main windings 108-109. As shown in FIG. 3, the power filter winding 302 is wrapped around a portion of the magnetic core 102 between the center limb 106 and the outer limb 105. In other embodiments, the power filter winding 302 can be wrapped around the center limb 106, such as across the magnetic gap 202 from the DC bias winding 110, or in any other suitable location of the magnetic core 102.

The power filter 304 may represent a broad-spectrum harmonic filter that is capable of allowing a harmonic filter level independent of input or output voltage level. In some embodiments, the power filter 304 is a passive L-C polyphase network power harmonic filter. The L and C components may be connected for either series or parallel resonant circuits. The power filter 304 provides efficient filtering for principal harmonics of the load power. For example, in a six-pulse rectified output power system, the power filter 304 may filter for the fifth, seventh, eleventh, thirteenth, nineteenth, and twenty-first harmonics. In other systems, such as a twelve-pulse or twenty four-pulse power system, the power filter 304 can provide filtering for other or additional harmonics. The power filter 304 operates without needing to draw extra output load current, which reduces problematic transformer $I^2R$ heating.

The power filter 304 can be galvanically isolated from the primary load inputs and outputs and thus can have a voltage level that is optimized for the power filter 304; its voltage is independent of the load or the source. The power filter 304 here is directly coupled to the magnetic core 102 of the transformer 300 through the power filter winding 302. The transformer 300 actively controls the amount of "leading power factor" (VARs) that is injected to the AC main line by reducing the VAR output of the power filter 304. This limits overcompensation without requiring high power electronic switching. This is in contrast to typical large power filters, which tend to overcompensate the AC input line with leading VARs when the load is light. Such overcompensation can cause the primary system voltage to rise beyond normal levels.

The power filter 304 can be tuned to one or more principal harmonics by configuration of the power filter winding 302. In some embodiments, the power filter winding 302 may include multiple independent windings, where each winding is tuned for a different harmonic. In some embodiments, the eleventh, thirteenth, and nineteenth harmonics may cause the most significant issues. Thus, the power filter winding 302 can include three independent shunt-connected windings that are respectively tuned to those harmonics, an example of which is shown in Table 1. In some embodiments, the total filter reactive power is approximately 230 kVAR for a 2500 kVA main input. Of course, other embodiments, including those having other total filter reactive power amounts and those having more, fewer, or different harmonics, are possible.

TABLE 1

Harmonic filter windings using the transformer 300

| Design Parameter | 11th Harmonic | 13th Harmonic | 19th Harmonic |
| --- | --- | --- | --- |
| Frequency (Hz) | 660 | 780 | 1140 |
| Reactive Power/Ø kVAR | 33.3 | 26.7 | 16.6 |
| Capacitance (uF) | 34.85 | 23.6 | 10.1 |
| Inductance (mH) | 1.67 | 1.76 | 1.93 |
| Current (A) | 69.4 | 55.5 | 34.7 |

By configuring the power filter winding 302 to tune the power filter 304 to different harmonics, it is possible to use an inexpensive commercial off-the-shelf (COTS) filter (such as a 480 V harmonic filter) for the power filter 304, rather than having one or more expensive specialized filters (such as 11 kV, 13.8 kV, or 4160 V filters). This reduces the overall size, weight, and cost of the power system.

In order for the transformer 300 to provide active control for the power filter 304, the power filter 304 may provide a feedback signal 306 to the DC amplifier 112. The feedback signal 306 can indicate a harmonic level as sensed at the power filter 304. In the transformer 300, the feedback signal 306 is in addition to the feedback signal 114 from the load output current or load voltage and the feedback signal 206 from the flux sensor 204. These signals 114, 206, 306 are input to the DC amplifier 112, which can process the signals 114, 206, 306 using any suitable routine or algorithm to determine the current to the DC bias winding 110 to control the flux level. In some embodiments, there is a hierarchy to the signals 114, 206, 306, with each signal having an electrical integrator circuit associated with each input. For example, the signal 114 could be the dominant feedback signal and have the shortest internal time delay (lag), the signal 206 could have the second priority and a moderate integrator time delay, and the signal 306 could have the last priority in the signal processing scheme and the longest integrator time delay.

In operation, the DC amplifier 112 monitors the feedback signal 114 from the load output current for phase (such as power factor) and amplitude to adjust the excitation level of the DC bias winding 110. When the load is light as indicated by a higher-than-normal flux through the core 102, the DC amplifier 112 increases the saturation control current to the DC bias winding 110, such as within 5-10 milliseconds on a 60 Hz system. If the system is at a higher frequency, such as 400 Hz, the response time is based on a one-quarter cycle response time. This increase in DC control current reduces the induced voltage in the power filter circuit and reduces the resonant current in the power filter 304. The DC saturation level also changes the inductance of the power filter 304. As the control current to the DC bias winding 110 increases, the AC inductance of each filter stage decreases and the capacitance remains constant, thus de-tuning the passive power filter 304.

Although FIG. 3 illustrates yet another example of an actively-controlled power transformer 300, various changes may be made to FIG. 3. For example, various components in FIG. 3 may be combined, further subdivided, replicated, omitted, or placed in any other suitable arrangement and additional components may be added according to particular needs. Again, power transformers come in a wide variety of configurations, and FIG. 3 does not limit this disclosure to any particular configuration of power transformer. Also, while FIG. 3 illustrates yet another example operational environment in which an actively-controlled power transformer can be used, this functionality may be used in any other suitable system.

Figure 4:
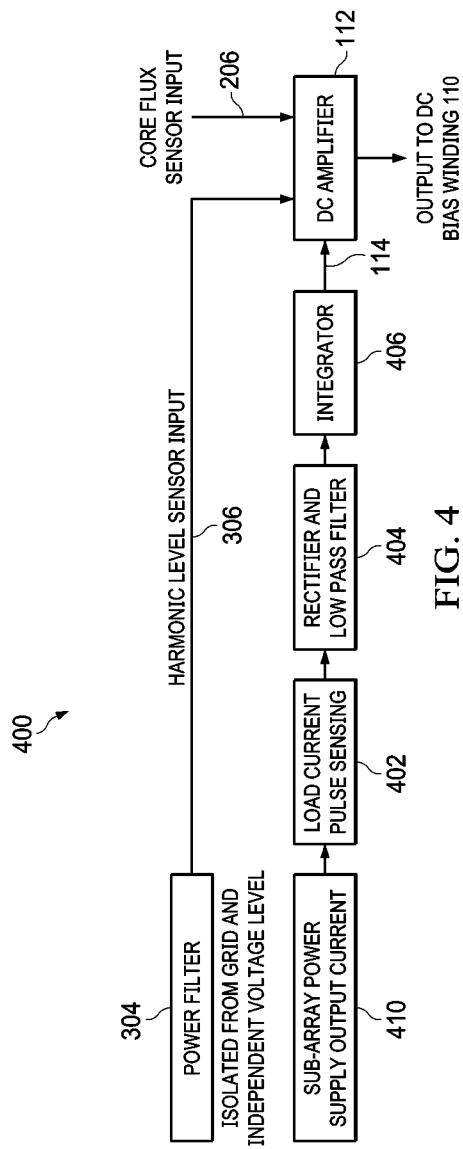
FIG. 4 illustrates an example signal processing system for use with an actively-controlled power transformer according to this disclosure.

FIG. 4 illustrates an example signal processing system 400 for use with an actively-controlled power transformer according to this disclosure. For ease of explanation, the system 400 is described as being used with the transformer 300 of FIG. 3. However, at least some portions of the system 400 may be used with any other suitable devices or systems, including the transformer 100 of FIG. 1 and the transformer 200 of FIG. 2.

As shown in FIG. 4, the system 400 includes a load current pulse sensing device 402, a rectifier and filter 404, and an integrator 406. The load current pulse sensing device 402 senses a pulsed load and a high rate of rise (di/dt) output current 410 (such as from a sub-array power supply of a radar), and generates a waveform signal that is input to the rectifier and filter 404. The rectifier and filter 404 rectifies the waveform signal and applies a low pass filter to the signal. The signal is then integrated by the integrator 406 into the feedback signal 114 before being output to the DC amplifier 112. Also shown in FIG. 4 is the feedback signal 206 sent to the DC amplifier 112 from the flux sensor 204 and the feedback signal 306 sent to the DC amplifier 112 from the power filter 304. The DC amplifier 112 has a summation junction of these three feedback signals 114, 206, 306 at its input whereby each signal has a distinct lag-lead network and distinct time constants. It is a further objective of the system 400 to prevent high di/dt or high surge load currents from appearing on the transformer primary windings and thus buffering the source power from high peak loads.

Although FIG. 4 illustrates one example of a signal processing system 400 for use with an actively-controlled radar power transformer, various changes may be made to FIG. 4. For example, various components in FIG. 4 may be combined, further subdivided, replicated, omitted, or placed in any other suitable arrangement and additional components may be added according to particular needs. As a particular example, the load output current 410 may be a load output voltage instead. In such an embodiment, the load current pulse sensing device 402 may be replaced with a load voltage sensing device. A further objective of a voltage sensing device is to exclude high dv/dt load surges from appearing at the transformer input windings. In general, signal processing systems come in a wide variety of configurations, and FIG. 4 does not limit this disclosure to any particular configuration of signal processing system. Also, while FIG. 4 illustrates one example operational environment in which a signal processing system can be used, this functionality may be used in any other suitable system.

Figure 5:
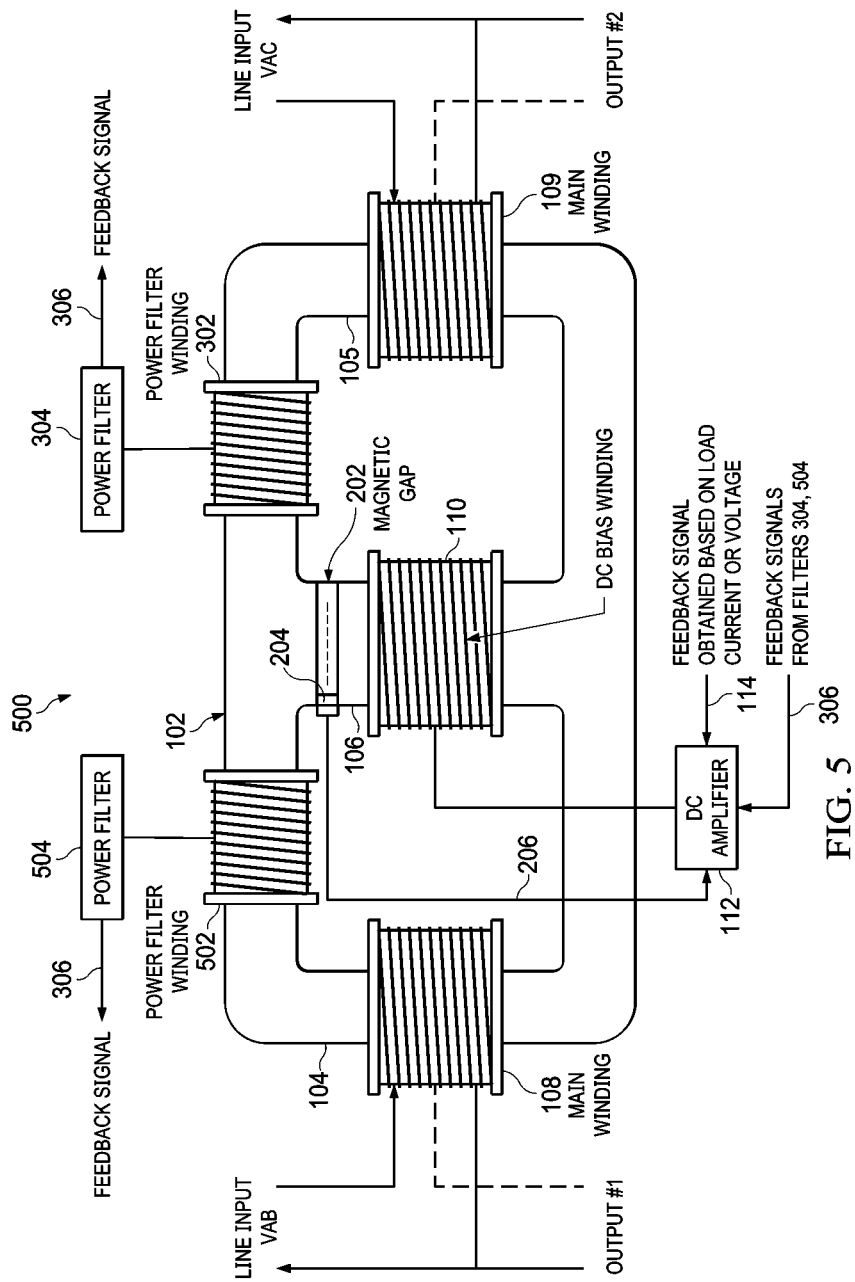
FIG. 5 illustrates yet another example actively-controlled power transformer according to this disclosure.

FIG. 5 illustrates yet another example actively-controlled power transformer 500 according to this disclosure. As described below, the transformer 500 is an actively-controlled power transformer that includes integral inrush current limiting and integral harmonic filtering. While the transformer 500 is described as a two-phase auto-transformer, the principles described here can apply to one-phase units or units with more than two phases, such as a three-phase galvanic isolation unit As shown in FIG. 5, the transformer 500 is very similar to the transformer 300 of FIG. 3. However, instead of one power filter 304 coupled to a power filter winding 302, the transformer 500 includes an additional power filter 504 coupled to an additional power winding 502. The power filter winding 502 is wound around the magnetic core 102 and is electrically isolated from the main windings 108-109. As shown in FIG. 5, the power filter winding 502 is wrapped around a portion of the magnetic core 102 between the center limb 106 and the outer limb 104. In other embodiments, the power filter winding 502 can be wrapped around the center limb 106, such as across the magnetic gap 202 from the DC bias winding 110, or in any other suitable location of the magnetic core 102.

Like the power filter 304, the power filter 504 may represent a broad-spectrum harmonic filter that is capable of allowing a harmonic filter level independent of input or output voltage level. In some embodiments, the power filter 504 is a passive L-C polyphase network power harmonic filter. The L and C components may be connected for either series or parallel resonant circuits. The power filter 504 also may provide a feedback signal 306 to the DC amplifier 112, similar to the power filter 304.

Although FIG. 5 illustrates yet another example of an actively-controlled power transformer 500, various changes may be made to FIG. 5. For example, various components in FIG. 5 may be combined, further subdivided, replicated, omitted, or placed in any other suitable arrangement and additional components may be added according to particular needs. FIG. 5 does not limit this disclosure to any particular configuration of power transformer. Also, while FIG. 5 illustrates yet another example operational environment in which an actively-controlled power transformer can be used, this functionality may be used in any other suitable system.

Figure 6:
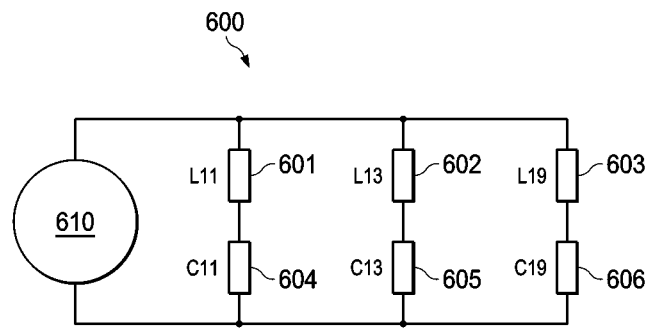
FIG. 6 illustrates a schematic of an example three-stage power filter for use with an actively-controlled power transformer according to this disclosure.

FIG. 6 illustrates a schematic of an example three-stage power filter 600 for use with an actively-controlled power transformer according to this disclosure. For ease of explanation, the filter 600 may represent the power filter 304 of FIG. 3 or the power filter 504 of FIG. 5. However, the power filter 600 may be used with any other suitable devices or systems, including the transformer 100 of FIG. 1 and the transformer 200 of FIG. 2.

As shown in FIG. 6, the power filter 600 can be a 230 kVAR power filter as described in Table 1, whereby selective tuning of the filter 600 to eleventh, thirteenth and nineteenth harmonics is accomplished with three branches of L-C components, including L components 601-603 and C components 604-606. In some embodiments, each branch has a separate current sensor that provides feedback to a master controller through a summation junction to form the feedback signal 306. The power filter 600 is coupled to a power filter winding 610, which can be a single-phase concentric winding placed on one or more limbs of a transformer, such as the transformer 300.

Although FIG. 6 illustrates one example of a power filter 600 for use with an actively-controlled power transformer, various changes may be made to FIG. 6. For example, various components in FIG. 6 may be combined, further subdivided, replicated, omitted, or placed in any other suitable arrangement and additional components may be added according to particular needs. Also, while the power filter 600 is described as tuned for the eleventh, thirteenth, and nineteenth harmonics, the power filter 600 could be tuned for other harmonics.

Figure 7:
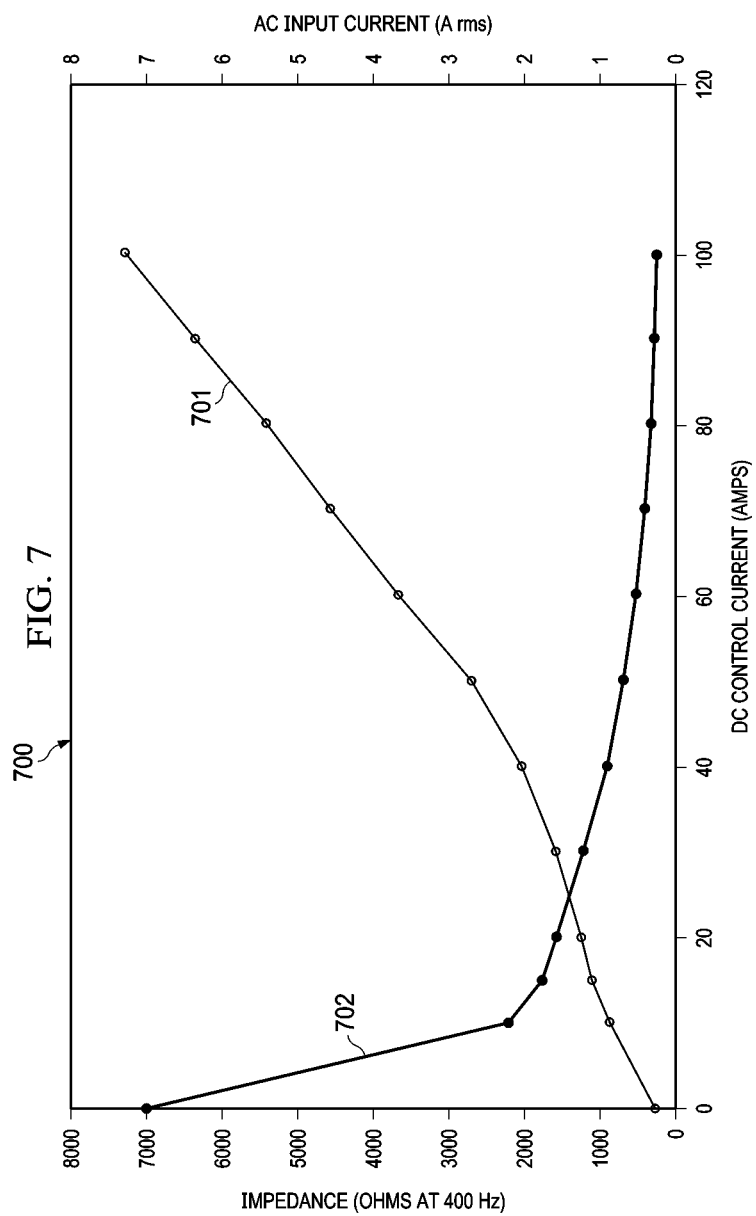
FIG. 7 illustrates a chart showing experimental results of a two-phase power transformer according to this disclosure.

FIG. 7 illustrates a chart 700 showing experimental results of a two-phase 4160 Volt 400 Hz power transformer of 1000 kVA rating, similar to the transformer 100 in FIG. 1 fitted with a DC bias winding on a central limb with a 0-100 Amp bias current. In the chart 700, the trace 701 shows AC input current, and the trace 702 shows the self-impedance of the AC windings. When the bias current is at zero, the self-impedance of the AC windings is a maximum of 6961 Ohms, and when the bias current is at 100 Amps, the self-impedance of the AC windings is reduced to 250 Ohms, indicating a 28:1 variation by changing the bias. Clearly the transformer is being operated inside and outside of the normal saturation region. The experimental results show the non-linear variation on impedance or inductance over the wide range of bias current, which was a continuous DC magnetization change rather than a pulsed magnetization.

Figure 8:
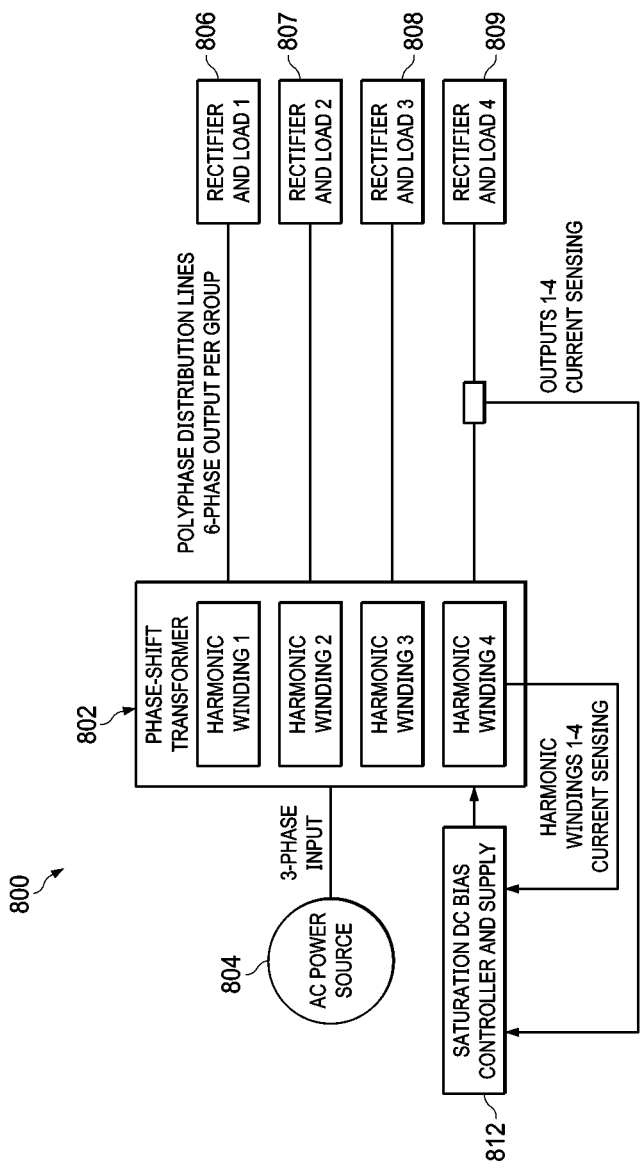
FIG. 8 illustrates an example power system in which an actively-controlled power transformer can be used, according to this disclosure.

FIG. 8 illustrates an example power system 800 in which an actively-controlled power transformer can be used, according to this disclosure. In some embodiments, the power system 800 (or a similar system) can be used with the one or more of the transformers described herein.

As shown in FIG. 8, the power system 800 includes a phase-shift transformer 802 that receives three-phase AC power from an AC power source 804. In some embodiments, the power system 800 is a 48 pulse system with harmonic current filtering within the transformer 802. In some embodiments, the phase-shift transformer 802 can represent (or can be represented by) the transformer 100, the transformer 200, the transformer 300, or the transformer 500. The transformer 802 transforms the received AC power and outputs six-phase power to multiple loads 806-809. Saturation within the transformer 802 is controlled by a DC bias controller 812, which may be similar to the DC amplifier 112.

Although FIG. 8 illustrates one example of a power system 800, various changes may be made to FIG. 8. For example, various components in FIG. 8 may be combined, further subdivided, replicated, omitted, or placed in any other suitable arrangement and additional components may be added according to particular needs.

Figure 9:
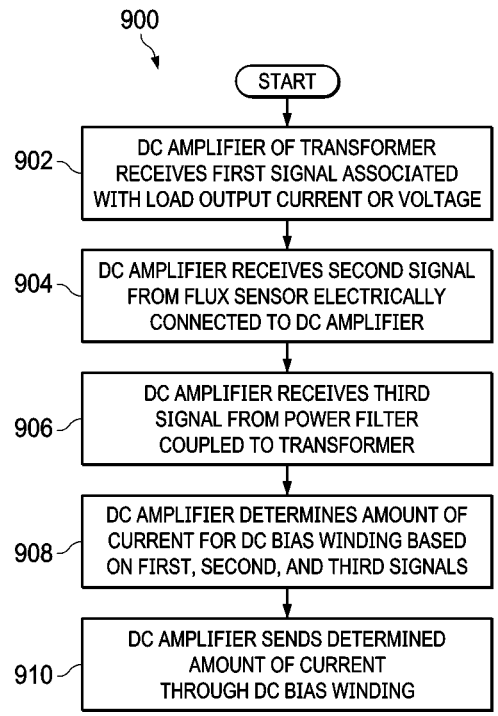
FIG. 9 illustrates an example method for controlling a power transformer according to this disclosure.

FIG. 9 illustrates an example method 900 for controlling a power transformer according to this disclosure. For ease of explanation, the method 900 of FIG. 9 may be described as being performed using the transformer 100 of FIG. 1, the transformer 200 of FIG. 2, or the transformer 300 of FIG. 3. However, the method 900 may involve the use of any other suitable devices or systems.

As shown in FIG. 9, at step 902, a DC amplifier of a transformer receives a first signal associated with a load output current or voltage. This may include, for example, the DC amplifier 112 receiving the feedback signal 114. The DC amplifier 112 is electrically connected to a DC bias winding 110 that is wound around a specified limb 106 of the magnetic core 102 of the transformer 100, 200, 300. The magnetic core 102 has multiple limbs 104-106 including the specified limb 106.

At step 904, the DC amplifier may optionally receive a second signal from a flux sensor electrically connected to the DC amplifier. This may include, for example, the DC amplifier 112 receiving the feedback signal 206 from the flux sensor 204. The second signal may be generated by the flux sensor 204 in response to a measurement of the amount of flux across a gap 202 in the specified limb 106.

At step 906, the DC amplifier may optionally receive a third signal from a power filter coupled to a power filter winding that is wound around the magnetic core. This may include, for example, the DC amplifier 112 receiving the feedback signal 306 from the power filter 304.

At step 908, the DC amplifier determines an amount of a current for the DC bias winding based on the first signal and optionally the second signal and the third signal. This may include, for example, the DC amplifier 112 determining the amount of the current for the DC bias winding 110 based on the feedback signal 114, the feedback signal 206, and the feedback signal 306.

At step 910, the DC amplifier sends the determined amount of current through the DC bias winding. This may include, for example, the DC amplifier 112 sending current in mark-space pulses or a continuous stream through the DC bias winding 110. The current through the DC bias winding 110 is configured to control flux saturation in the magnetic core 102 of the transformer 100, 200, 300 and alter the magnetic permeability of the component magnetic limbs.

Although FIG. 9 illustrates one example of a method 900 for controlling a power transformer, various changes may be made to FIG. 9. For example, while shown as a series of steps, various steps in FIG. 9 may overlap, occur in parallel, occur in a different order, or occur any number of times.

As described above, the disclosed embodiments provide actively-controlled power transformers that are capable of current limiting and also allow active tuning of L-C filters. This is advantageous for many applications, such as mobile or land-based radar systems that currently require large filter banks or large power transformers with heavy inrush current limiting devices and marine power systems that currently require extensive current limiting and harmonic filtering. The disclosed embodiments reduce overall power system size and weight (such as a weight reduction of approximately 20% in some systems) and avoid having input power being overcompensated for high leading power factor loads. The disclosed embodiments are applicable to both auto-transformers and galvanic isolation transformers of either low-voltage or high-voltage design.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A transformer comprising:
a magnetic core having multiple limbs;
a direct current (DC) bias winding wound around a specified one of the multiple limbs; and
a DC amplifier electrically connected to the DC bias winding, the DC amplifier configured to:
receive a first signal associated with a load output current or a load output voltage;
determine an amount of a current for the DC bias winding based on the first signal; and
send the determined amount of current through the DC bias winding.

2. The transformer of claim 1, wherein the determined amount of current is configured to control flux saturation in the magnetic core.

3. The transformer of claim 1, wherein the specified limb is a center limb of the magnetic core.

4. The transformer of claim 1, wherein the first signal is generated based on an integrated value of the load output current or the load output voltage.

5. The transformer of claim 1, further comprising:
a flux sensor disposed in a gap in the specified limb, the flux sensor electrically connected to the DC amplifier and configured to sense an amount of flux across the gap.

6. The transformer of claim 5, wherein the DC amplifier is configured to determine the amount of the current for the DC bias winding based on the first signal and a second signal from the flux sensor.

7. The transformer of claim 6, wherein the flux sensor is configured to generate the second signal in response to a measurement of the amount of flux across the gap in the specified limb.

8. The transformer of claim 5, further comprising:
a power filter coupled to a power filter winding that is wound around the magnetic core.

9. The transformer of claim 8, wherein the DC amplifier is configured to determine the amount of the current for the DC bias winding based on the first signal, a second signal from the flux sensor, and a third signal from the power filter.

10. The transformer of claim 8, wherein the power filter is galvanically isolated from a primary load.

11. The transformer of claim 8, wherein the power filter comprises a polyphase power harmonic filter.

12. The transformer of claim 8, wherein the power filter winding comprises multiple windings, each winding of the multiple windings tuned to a different harmonic.

13. A method comprising:
receiving, at a direct current (DC) amplifier, a first signal associated with a load output current or a load output voltage;
determining an amount of a current for a DC bias winding based on the first signal; and
sending, by the DC amplifier, the determined amount of current through the DC bias winding;
wherein the DC bias winding is electrically connected to the DC amplifier; and
wherein a magnetic core has multiple limbs, the DC bias winding wound around a specified one of the multiple limbs.

14. The method of claim 13, wherein the determined amount of current is configured to control flux saturation in the magnetic core.

15. The method of claim 13, wherein the first signal is generated based on an integrated value of the load output current or the load output voltage.

16. The method of claim 13, further comprising:
sensing, by a flux sensor, an amount of flux across a gap in the specified limb, the flux sensor disposed in the gap and electrically connected to the DC amplifier.

17. The method of claim 16, wherein determining the amount of the current for the DC bias winding is based on the first signal and a second signal from the flux sensor.

18. The method of claim 16, further comprising:
using a power filter coupled to a power filter winding that is wound around the magnetic core.

19. The method of claim 18, wherein determining the amount of the current for the DC bias winding is based on the first signal, a second signal from the flux sensor, and a third signal from the power filter.

20. The method of claim 18, wherein the power filter winding comprises multiple windings, each winding of the multiple windings tuned to a different harmonic.

21. The method of claim 18, wherein the power filter winding has a voltage level independent of a line voltage or a load voltage.

22. The method of claim 18, wherein the power filter includes at least one capacitive element and at least one inductive filter element.

* * * * *